United States Patent [19]

Buck

[11] Patent Number: 4,954,834

[45] Date of Patent: Sep. 4, 1990

[54] MOVABLE OPTICAL FIBER SYSTEM FOR DIRECTING MICROWAVES

[75] Inventor: Daniel C. Buck, Hanover, Md.

[73] Assignee: Westinghouse Electric Corp., Pittsburgh, Pa.

[21] Appl. No.: 215,117

[22] Filed: Jul. 5, 1988

[51] Int. Cl.[5] .......................... H01Q 3/00; G01S 7/40; G01R 35/00

[52] U.S. Cl. .................................... 342/360; 342/174; 343/703

[58] Field of Search ........................ 342/173, 174, 360; 343/703

[56] References Cited

U.S. PATENT DOCUMENTS 4,453,164 6/1984 Patton ................................ 342/360

OTHER PUBLICATIONS

"Precise Measurements of Antenna Characteristics Using A Fiber Optical Link"; Hornung-Pendersen et al., 11-1978, pp. 278-281.

*Primary Examiner*—Gregory C. Issing

*Attorney, Agent, or Firm*—Joseph C. Spadacene

[57] ABSTRACT

A movable optical fiber system for directing test and calibration signals to the individual transmit-receive modules of a phased array antenna is provided with a laser device for generating optic signals. The laser device also includes a circuit for amplitude modulating the optic signals prior to their exiting the laser device. A fixed length of fiber-optic cable is connected with the laser device for directing the generated optic signals to a photodiode secured for movement to a motion device positioned adjacent the antenna face. The photodiode converts the optic signals to equivalent microwave signals, and the microwave signals are thereafter passed through a waveguide connected with the photodiode. Both the photodiode and waveguide are moved in a preselected linear path across the antenna face by the motion device; and, as the motion device operates to move the photodiode and waveguide, microwave test and calibration signals are discharged from the waveguide to be received by the individual transmit-receive modules in succession.

7 Claims, 2 Drawing Sheets

MOVABLE OPTICAL FIBER SYSTEM FOR DIRECTING MICROWAVES

BACKGROUND OF THE INVENTION

1. Field of the Invention

This invention relates to a device for directing signals to an antenna, and more particularly, to a fiberoptic device for directing test and calibration signals to the individual transmit-receive modules of a phased array antenna.

2. Background Information

The utilization of traditional far-field techniques for testing and calibrating the individual transmitreceive (T/R) modules of a phased array antenna requires a small number of RF field strength measurements to be taken at such a distance (range) from the modules that the modules appear as a point source of radiation. Due to the large size of many commercially available phased array antennas, the range required to implement far-field testing techniques is well over a mile in length. Over these great distances, it is extremely difficult to control environmental factors such as weather, reflections from nearby objects and external sources of interfering signals. It has been found that the inability to control these factors makes far-field testing of large phased-array antennas extremely impractical.

Because of the difficulties encountered with traditional far-field testing, it is preferred to utilize a near-field testing scheme to test and calibrate large-scale phased array antennas.

Near-field testing, however, requires the construction of special facilities and equipment to both house the antenna and perform the alignment, testing and calibration of the individual T/R modules. This technique involves the taking of a large number of measurements at a very close proximity to the face of the antenna array. An RF probe mounted on a large X-Y scanner or plotter is used to make these measurements, and known digital signal techniques are utilized to convert the measurements to the same types of antenna patterns which would be obtainable by far-field testing.

Although this method avoids many of the environmental difficulties encountered with far-field testing, known near-field test devices utilize a coaxial cable to transmit the test and calibration signals from the signal generating equipment to the RF probe. The signals are thereafter introduced into a waveguide or feedhorn, which is also mounted on the scanner, and the open end of the waveguide is passed in proximity to the plurality of individual T/R modules secured to the antenna face. Since the RF probe and waveguide must be moved both horizontally and vertically by the X-Y scanner to provide test and calibration signals to the T/R modules in succession, the coaxial cable must have a length sufficient to freely travel with the RF probe and waveguide. The length of the coaxial cable required to permit free travel of the RF probe and waveguide causes the cable to be extremely heavy and requires a substantial coaxial cable support system which is separated from the X-Y scanner. In addition, an end portion of the coaxial cable must be secured to the structural framework of the scanner in order to permit a tension-free connection between the cable and RF probe. As a result, the scanner structural framework must be built to withstand the combined weight of the RF probe, waveguide, and a portion of the coaxial cable.

The massive scanner structural framework must be properly shielded with suitable microwave absorbing material, and the additional weight of the microwave shielding necessitates a still further enlargement of the framework of the X-Y scanner. It can be appreciated that fabricating an X-Y scanner having a framework sufficient to totally support the RF probe, waveguide, cable and shielding material is extremely costly. In addition, the sheer weight of the scanner framework makes it difficult to move the scanner the incremental distances required to align the open end of the waveguide with the individual T/R modules in the array.

Therefore, there is a need for an improved system for directing test and calibration signals to the individual T/R modules of a phased array antenna in a near-field test facility which overcomes the deficiencies of presently used systems. The improved system must include means for passing signals from the signal generating equipment to the RF probe which eliminates the need for coaxial cable and its attendant cable support system. Eliminating the use of coaxial cable and its support system greatly reduces the loading experienced by the X-Y scanner, and allows the scanner framework to be reduced to both size and weight.

SUMMARY OF THE INVENTION

It is an object of the present invention to provide an improved test and calibration signal-directing system for use in a near-field testing scheme which utilizes a fiber-optic cable to direct the test and calibration signals from the signal generating equipment to the RF probe and waveguide. In this case, the RF probe is a photodiode-type receiver which converts an optic signal received from the fiber-optic cable to an equivalent microwave signal. Since the fiber-optic cable is much lighter in weight and smaller in physical size than presently used coaxial cable, both the overall weight and physical size of the X-Y scanner structural framework may be greatly reduced. It can be appreciated that reducing the physical size and weight of the scanner framework reduces the amount of microwave absorbing material required for proper framework shielding; and allows the movements of the scanner to be more easily controlled to align the open end of the waveguide with the individual antenna T/R modules.

In accordance with the present invention, there is provided a movable optical fiber system for directing microwave test and calibration signals to the individual transmit-receive modules of a phased array antenna which includes means for generating microwave modulated optic test and calibration signals of preselected phase. A photodiode means is provided for receiving the microwave, amplitude modulated optic signals and converting the signals to microwave test and calibration signals. A waveguide is connected with the photodiode means for receiving the microwave test and calibration signals, and has an open end portion through which the microwave signals are discharged. Fiber-optic means is also provided which has an end portion connected with the optic signal generating and modulating means and an opposite end portion connected with the photodiode means. The fiber TM optic means is utilized to pass the optic test and calibration signals from the optic signal generating and modulating means to the photodiode means. The photodiode means and waveguide are adapted for movement in a preselected linear path parallel with the plurality of transmit-receive modules secured to the face of the phased array antenna. As the waveguide is passed in proximity to the modules, the microwave test and calibration signals are discharged through the waveguide open end portion to be received by the plurality of transmit-receive modules in succession.

Further in accordance with the present invention, there is provided a method for providing microwave test and calibration signals to the individual transmit-receive modules of a phased array antenna comprising the steps of generating modulated, optic test and calibration signals of preselected phase and providing the optic test and calibration signals to a photodiode means via a fixed length of fiber-optic cable. The method includes the further steps of converting the amplitude modulated optic test and calibration signals within the photodiode means to equivalent microwave signals, and providing the microwave test and calibration signals to a waveguide having an open end portion through which the microwave signals are discharged. The photodiode means and waveguide are passed in a preselected linear path parallel with a plurality of transmit-receive modules secured to the antenna face to pass the waveguide open end portion in proximity to each of the modules. As the waveguide open end portion is passed in proximity to the modules, the microwave test and calibration signals are discharged through the waveguide open end portion to be received by the plurality of transmit-receive modules in succession.

DESCRIPTION OF THE PREFERRED EMBODIMENTS

Figure 1:
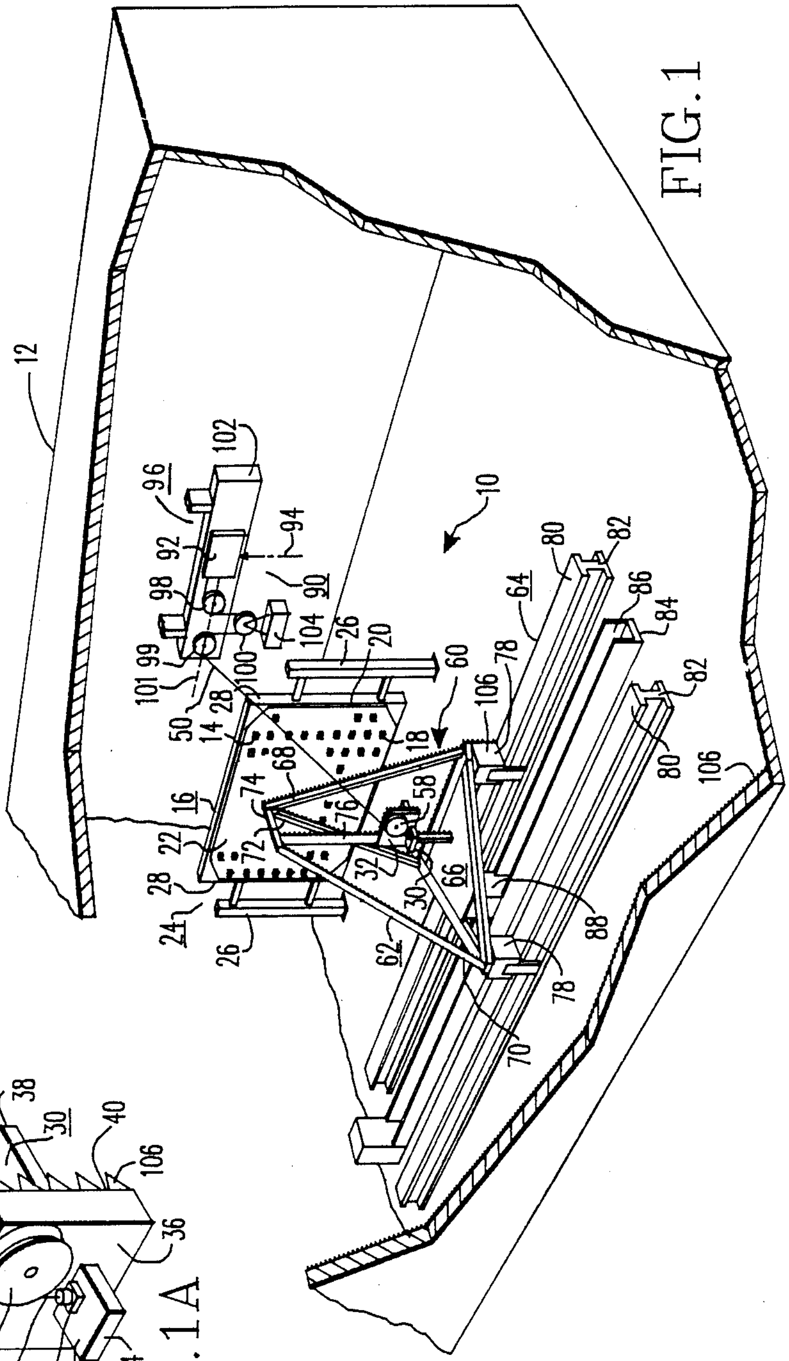
FIG. 1 is a perspective view of the movable optical fiber system of the present invention which is housed in a near-field antenna testing facility and utilized to direct microwave test and calibration signals to the individual transmit-receive modules of a phased array antenna.

Referring to the drawings, and particularly to FIG. 1, there is illustrated a movable optical fiber system for directing microwaves generally designated by the numeral 10 housed in a phased array antenna near-field test facility 12. Movable optical fiber system 10 is operable to provide test and calibration signals, or other suitable signals, to the individual transmit-receive (T/R) modules 14 of a phased array antenna 16 by directing microwave sine waves to each T/R module 14 in succession. As will become readily apparent herein, movable optical fiber system 10 is a great improvement over traditional far-field antenna test systems which require the antenna to be spaced from the test signal generator by a sufficiently large distance (range) to allow the antenna to appear as a point source of radiation. Although movable optical fiber system 10 is described herein as being operable to provide test and calibration signals or other desired signals to the individual T/R modules secured to the face of the antenna, it should be understood that optical fiber system 10 may also be operated, if desired, to receive signals from the individual T/R modules.

As known in the art, phased array antenna 16 includes a plurality of rows 18 and columns 20 (one of each are shown) of individual T/R modules 14. In order to test and calibrate the plurality of T/R modules 14, sinusoidal microwave signals must be provided in succession to each of the individual modules secured to the face 22 of antenna 16. With the antenna 16 rigidly secured against movement in a test station 24 which, by way of example, may include a pair of spaced-apart uprights 26 connected with the sides 28 of antenna 16, the sinusoidal microwave signals are delivered to the individual T/R modules via a waveguide or feedhorn 30 secured to a support member 32 which forms a part of movable optical fiber system 10. As will be explained later in greater detail, the sinusoidal microwave test and calibration signals are produced by a microwave signal generator and converted to equivalent microwave modulated optical signals. The optic signals are thereafter passed through a fiber-optic cable and delivered to a photodiode in the waveguide where they are reconverted to microwave signals for delivery to the modules of antenna 16.

Figure 1A:
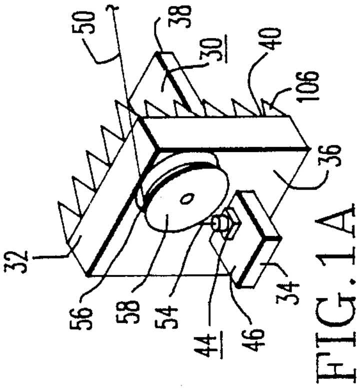
FIG. 1A is a perspective view of a portion of the movable optical fiber system of FIG. 1, illustrating a photodiode or optic signal conversion unit connected with a waveguide.
Figure 1B:
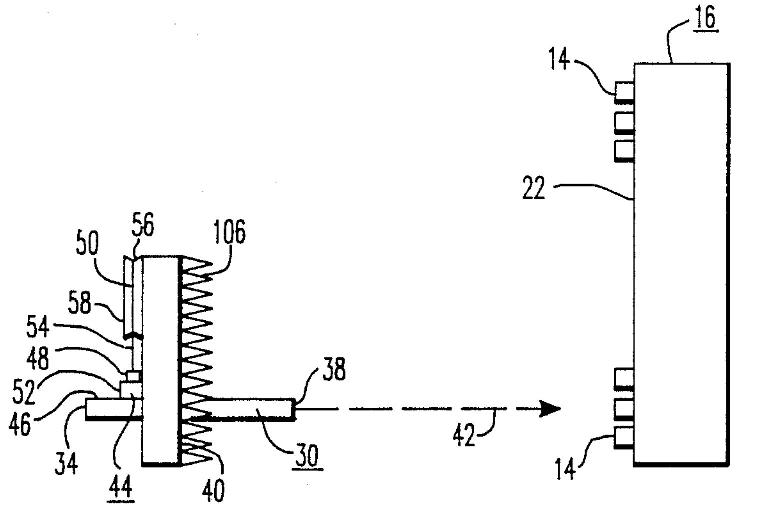
FIG. 1B is a view in side elevation of a phased array antenna having a plurality of individual transmitreceive modules secured to the antenna face, and illustrating the position of the waveguide during transmission of test and calibration signals to an individual module.

As seen in FIG. 1, and particularly in FIGS. 1A and 1B, waveguide 30, which is itself known in the art, has a hollow interior portion (not shown), a closed rear wall portion 34 which extends outwardly from the rear wall 36 of support member 32, and an open front portion 38 which extends outwardly from the front wall portion 40 of support member 32. As previously stated, waveguide 38 is a hollow structural member, and is designed to permit a microwave signal introduced into the hollow interior portion adjacent rear wall 34 to pass therethrough and exit open front portion 38. The sinusoidal microwave signal passed through the open front portion 38 of waveguide 30, which is illustrated schematically in FIG. 1B by the arrow 42, is thereafter received by a single T/R module 14 which is both horizontally and vertically aligned with the waveguide open front portion 38. As known in the art, microwave signal 42 provides each T/R module 14 with simulated beam update data, and the reaction of each T/R module to this data is monitored to determine whether the individual T/R modules are functioning properly.

The sinusoidal microwave signal is introduced into the hollow interior portion of waveguide 30 by means of an optical-to-microwave signal conversion unit or photodiode 44 which is secured to the top surface 46 of waveguide 30. Conversion unit 44, which itself is commercially available from Hewlett-Packard Corporation, ORTEL Corporation and others, and operates as a photodiode-type receiver or RF probe which transforms a received optic signal into an equivalent microwave signal. As seen in FIGS. 1A and 1B, photodiode-type receiver 44 includes an input section 48 for receiving an optic signal delivered from a fiber-optic cable 50 connected thereto, and also includes an output section 52 which communicates with the hollow interior of waveguide 30. Within output section 52, the received optic signal is converted into an equivalent sinusoidal microwave signal and thereafter introduced into the hollow interior of waveguide 30.

As previously described, conversion unit 44 receives an optic signal from fiber optic cable 50. The end portion 54 of fiber-optic cable 50 is connected with the input section 48 of conversion unit 44, and, as seen in FIGS. 1A and 1B, a portion of the fiber-optic cable adjacent the cable end portion contacts the peripheral groove 56 of a precision circular pulley 58 nonrotatably secured to the rear wall 36 of support member 32. As will be explained later in greater detail, precision circular pulley 58 is utilized to support fiber-optic cable 50 adjacent the cable end portion 54 as conversion unit 44 and waveguide 30 are moved in a plane parallel to the face of antenna 16 to provide signals to each T/R module 14 in the array. Thus pulley 58 must have a diameter sufficiently large to reduce the flexing or bending of coaxial cable 50 and maintain the phase of the optic signal passed through the cable substantially constant.

As previously stated, it is required in a nearfield testing scheme to provide test and calibration signals to each of the T/R modules 14 of antenna 16 in succession. Since the positions of antenna 16 and the plurality of T/R modules 14 are fixed by the test station 24, it can be seen that waveguide 30 must be capable of both horizontal and vertical movement in order to align the waveguide open front portion 38 with each T/R module. As seen in FIG. 1, horizontal and vertical movement of waveguide 30 in a plane substantially parallel with the face 22 of antenna 16 is accomplished via a motion device or X-Y scanner generally designated by the numeral 60, which includes a support frame 62 mounted for movement on a track system 64.

Support frame 62 includes a bottom frame member 66 with legs 68, 70, 72 extending upwardly therefrom. A horizontally extending connecting member 74 joins the upper end portions of the legs 68, 70, 72. A guide member 76 extends between bottom frame member 66 and horizontally extending connecting member 74, and waveguide 30 support member 32 is secured for vertical movement thereto. A suitable drive mechanism (not shown) is provided and is operable to move support member 32 in a preselected vertical direction on guide member 76. Although a specific drive system is not illustrated in FIG. 1, it should be understood that drive systems which perform the type of operation described herein are well known in the art and are available from numerous commercial suppliers. Since conversion unit 44 and waveguide 30 are connected with support member 32, it can be seen that vertical movement of support member 32 on guide member 76 results in vertical movement of conversion unit 44 and waveguide 30.

As seen in FIG. 1, guides 78 (two shown) are secured to bottom frame member 66 and extend downwardly therefrom to contact the top surfaces 80 of a pair of track system 64 rail sections 82. The pair of rail sections 82 are positioned in substantially parallel relationship with each other, and are also positioned in substantially parallel relationship with the face 22 of antenna 16. A U-shaped channel member 84 is interposed between the pair of rail sections 82 as shown, and has a hollow interior portion 86 arranged to receive a downwardly extending drive-connecting member 88 secured to bottom frame member 66. As known in the art, a screw shaft (not shown) or other suitable drive mechanism, such as a chain drive or cable drive mechanism, may be positioned within the hollow interior portion 86 of channel member 84 to engage drive-connecting member 88. Operation of the screw shaft or other drive mechanism imparts horizontal movement to support frame 62 along the top surfaces 80 of the pair of rail sections 82. It should be pointed out that since both the horizontally and vertically adjacent T/R modules on the face 22 of antenna 16 are spaced a relatively small distance from each other, the drive mechanisms utilized to move waveguide support member 32 vertically on guide member 76 and support frame 62 horizontally on rails 82 must be capable of imparting movement over incremental distances to properly align the open end of waveguide 30 with a desired module. In addition, it should be understood that although specific embodiments of support frame 62 and track system 64 are described herein, numerous alternate embodiments of the support frame and track system can be utilized with similar results. Any alternate embodiment must also be capable of moving conversion unit 44 and waveguide 30 horizontally and vertically in a plane parallel with the face 22 of antenna 16 to align the open front portion 38 of waveguide 30 with each T/R module 14 in the antenna array.

As previously described, an optic signal is provided to conversion unit 44 and converted therein to a corresponding sinusoidal microwave signal for delivery to the waveguide. Referring to FIG. 1, the optic signal is produced within an optic signal generating section generally designated by the numeral 90 and provided to conversion unit 44 by the fiber optic cable 50 previously described.

Optic signal generating unit 90 includes a conventional laser device 92 adapted to receive a sinusoidal microwave signal from a microwave signal generator schematically illustrated by the arrow 94. The construction and operation of laser device 92 are known in the art and a suitable laser device may be obtained from ORTEL Corporation in Alhambra, California. Within laser device 92, the sinusoidal microwave signal is first converted to anoptic signal, and thereafter the optic signal is amplitude modulated to produce an amplitude modulated optic signal. Since optic signal generating unit 90 is physically separated from motion device 60, the optic signal exiting laser device 92 is passed to the input section 48 of conversion unit 44 via the fixed length section of fiber-optic cable 50. Fiber-optic cable 50 is preferably a single mode fiber-optic cable and is commercially available from multiple suppliers one such supplier being Corning Glass. The use of a single mode fiber-optic cable is desired to prevent phase changes in the optic signal passed through the cable due to temperature variations experienced by the cable. However, if the temperature within near-field test facility 12 is controlled within a relatively narrow range, a multimode fiber-optic cable with quadratic index variation depending cable radius may also be used if desired.

As seen in FIG. 1, fiber-optic cable 50 is passed through a feeding station 96 interposed between laser device 92 and pulley 58 secured to the rear wall 36 of support member 32. Feeding station 96 is operable to maintain fiber-optic cable 50 at a substantially constant value of tension as support frame 62 is moved horizontally on track system 64 and waveguide support member 32 is moved vertically on guide member 76.

Feeding station 96 includes a pair of first pulleys 98, 99 and a second pulley 100. Each of the pulleys 98, 99, 100 includes a peripheral groove having a diameter substantially identical to the diameter of pulley 58 peripheral groove 56. The pair of first pulleys 98, 99 are secured for rotational movement to a backing member 102 which supports signal generating section 90, and second pulley 100 is free to move in a linear path perpendicular to the axis of the pair of first pulleys 98, 99 schematically illustrated by the numeral 101.

As seen in FIG. 1, fiber-optic cable 50 is reeved about the pair of first pulleys 98, 99 and second pulley 100. A tensioning means 104 in the form of a weight is connected with second pulley 100, and operates to maintain a substantially constant value of tension on fiber-optic cable 50 as support frame 62 is moved horizontally on track system 64 and waveguide support member 32 is moved vertically on guide member 76.

As described, as support frame 62 is moved horizontally on track system 64 in a direction either toward or away from optic signal generating unit 90, second pulley 100 is moved either downwardly or upwardly relative to the first pulleys 98, 99 to either take up or pay off slack in fiber-optic cable 50. Weight 104 maintains fiber-optic cable 50 at a substantially constant value of tension to prevent phase changes of the optic signal traveling therethrough. In like manner, weight 104 operates to maintain fiber-optic cable 50 at a substantially constant value of tension as waveguide support member 32 is moved vertically on guide member 76.

With this arrangement, the open front portion 38 of waveguide 30 may be positioned at any desired location relative to the face 22 of the antenna 16 to transmit test and calibration signals to an individual T/R module 14. The use of a fiber-optic cable to pass test and calibration signals from laser device 92 to waveguide 30 eliminates the need for presently used coaxial cable and its attendant cable support structure which is extremely heavy, and permits support frame 62 to be reduced in size. The reduction in the physical size of support frame 62 reduces the overall amount of microwave absorbing material 106 which must be used to cover the metallic structural members 66, 68, 70, 72, 74 and 76 of the support frame. One type of microwave absorbing material is sold under the trademark ELLOFOAM and is made by Emerson & Cummings Company.

It should be understood that although a specific embodiment of tensioning means 104 is illustrated and described herein, numerous alternate embodiments of the tensioning means can be utilized with similar results. However, any alternate tensioning means utilized must be capable of maintaining fiber-optic cable 50 at a substantially constant value of tension for all positions of waveguide 30 relative to antenna face 22.

As previously described, maintaining a substantially constant value of tension on fiber-optic cable 50 as support frame 62 and waveguide support member 32 are moved along their respective paths of travel is desired in order to prevent changes in phase of the optic signal passed through fiber-optic cable 50, and weight 104 is employed for this purpose. In addition to maintaining a substantially constant value of tension on fiber-optic cable 50, it is also desired to control the rate of bending of the fiber-optic cable, since it is known that excessive bending or flexing of the cable will also result in an optic signal phase change.

Figure 2:
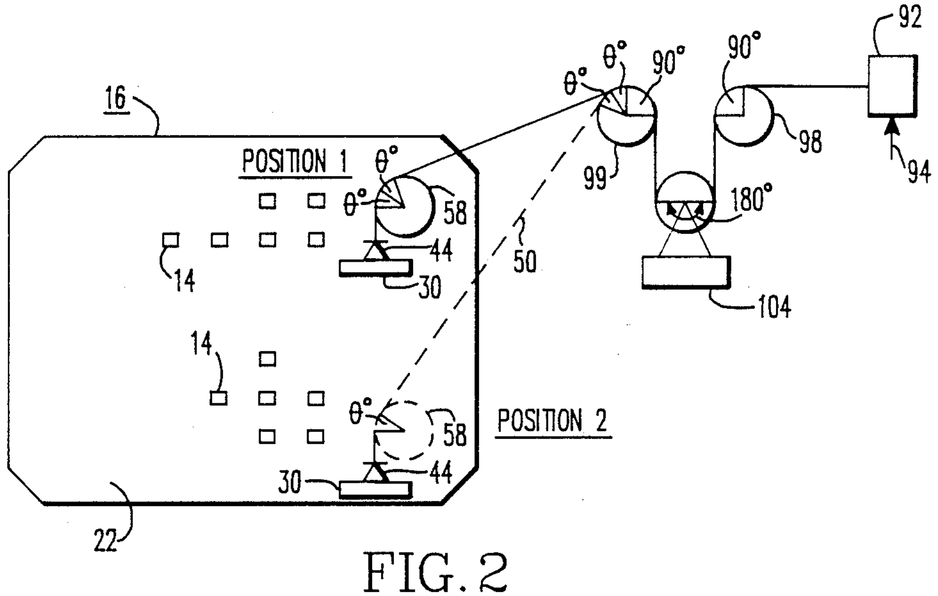
FIG. 2 is a schematic representation of a phased array antenna and the movable optical fiber system of the present invention, illustrating various positions of the optic signal conversion unit and waveguide relative to a phased array antenna face during near-field testing, and further illustrating the relationship between the fiber optic cable and various pulleys which form a part of this invention.

The bending of fiber-optic cable 50 at various positions (two shown) of pulley 58 and conversion unit 44 relative to the face 22 of antenna 16 is illustrated in FIG. 2. It has unobviously been found that, by selecting a diameter for first and second pulleys 98, 99, 100 and pulley 58 which is sufficiently large to reduce the overall bending or flexing of fiber-optic cable 50 for all positions of waveguide support member 32 relative to antenna face 22, the total mode coupling of the optic signal traveling through fiber-optic cable 50 can be reduced to an acceptably small value which will remain unchanged for all positions of support member 32. Stated in another manner, by selecting a sufficiently large pulley diameter above which acceptably minimum mode coupling occurs, the total mode coupling can be reduced to a minimum level to prevent undesired phase changes in the optic signal. In order to prevent undesired phase changes in the optic signal due to excess cable flexing or bending, the overall length of fiber-optic cable 50 physically in contact with the peripheral grooves of pulleys 58, 98–100 should remain substantially constant.

Thus, if the fiber-optic cable is maintained at a substantially constant value of tension and the overall length of the cable physically in contact with the pulleys remains substantially constant for all positions of waveguide support member 32 relative to antenna face 22, the optic signals produced by laser device 92 will not be altered upon their passage through fiber-optic cable 50.

The preferred scheme for maintaining the overall length of fiber-optic cable 50 in physical contact with the pulleys 58, 98–100 substantially constant for all positions of conversion unit 44, waveguide 30 and pulley 58 relative to antenna face 22 is illustrated in FIG. 2. Support member 32 has not been shown for clarity.

As seen in FIG. 2, with pulley 58, conversion unit 44 and waveguide 30 located at position 1 to provide a test and calibration signal to an individual T/R module on antenna face 22, fiber-optic cable 50 contacts first pulley 98 over 90° and contacts second pulley 100 over 180°. Also at position 1, fiber-optic cable 50 contacts first pulley 99 over a total angle of $90°+\theta°$ and contacts sheave 58 over $2\theta°$. Thus, at position 1, fiber-optic cable 50 contacts pulley 58 and first and second pulleys 98, 99, 100 over a total angular length of $360°+90°$.

Upon downward vertical movement of support member 32 on guide member 76 to place pulley 58, conversion unit 44 and waveguide 30 at position 2 illustrated in phantom. fiber-optic cable 50 contacts first pulley 98 and second pulley 100 over a total of 270°. Also at position 2, fiber-optic cable 50 contacts first pulley 99 over a total angle of $90°+2\theta°$ and contacts pulley 58 over a total angle of $\theta°$. Thus, at position 2, fiber-optic cable 50 contacts pulley 58 and first and second pulleys 98, 99, 100 over a total angular length of $360°+90°$.

It can be seen that for all positions of pulley 58, conversion unit 44 and waveguide 30 relative to antenna face 22, the total length of fiber-optic cable 50 in contact with the various pulleys remains constant. Since the total length of cable that is bent or curved by the pulleys remains constant, the phase of the optic signal passing through the cable remains substantially constant. Since the pulleys 58, 98–100 all lie in a single plane parallel with antenna face 22, bending of fiber optic cable 50 in a direction either towards or away from antenna face 22 is eliminated to further insure that the phase of the optic signal passing through the cable remains substantially constant.

As described herein, sinusoidal microwave signals provided from a source are converted to equivalent optic signals, passed through a fiber-optic cable, and reconverted to sinusoidal microwave signals. The reconverted signals are transmitted to the individual T/R modules of a phased array antenna via a section of waveguide. Maintaining a substantially constant value of tension on the fiber-optic cable, and maintaining the overall bent length of cable in contact with the various pulleys substantially constant prevents undesired changes in the phase of the optic signal as the signal is passed through the coaxial cable.

Although the present invention has been described in terms of what are at present believed to be its preferred embodiments, it will be apparent to those skilled in the art that various changes may be made without departing from the scope of the invention. It is therefore intended that the appended claims cover such changes.

I claim:

1. A movable optical fiber system comprising:

means for generating microwave modulated optic signals of preselected phase;

photodiode means for receiving said optic signals and converting said optic signals to microwave signals;

a waveguide connected with said photodiode means for receiving said microwave signals, said waveguide having an open front portion through which said microwave signals are discharged;

fiber-optic means having an end portion connected with said optic signal generating means and an opposite end portion connected with said photodiode means, said optic signals being passed through said fiber-optic means from said optic signal generating means to said photodiode means;

said photodiode means and said waveguide being adapted for linear movement by a motion device in a plane parallel with a phased array antenna face having a plurality of transmit-receive modules secured thereon to pass said waveguide open front portion in proximity to said plurality of modules;

said transmit-receive modules successively receiving said microwave signals discharged through said waveguide open front portion, a motion device adapted to be positioned adjacent said phased array antenna face;

a support member connected with said motion device and having said photodiode means and said waveguide connected thereto;

said motion device being operable to move said support member with said photodiode means and said waveguide connected thereto in a preselected horizontal and vertical path parallel with said antenna face;

pulley means secured to said support member in proximity with said photodiode means and movable with said photodiode means and said waveguide;

said pulley means having a peripheral groove of preselected diameter for receiving a portion of said fiber-optic means adjacent said fiber-optic means opposite end portion; and said peripheral groove diameter being selected to provide that said portion of said fiber-optic means in contact with said groove is flexed by less than a preselected maximum degree as said pulley is moved by said motion device to prevent a change in phase of said optic signal passed through said fiberoptic means.

2. A movable optical fiber system for directing microwave test and calibration signals to the individual transmit-receive modules of a phased array antenna comprising:

means for generating microwave modulated optic signals of preselected phase;

photodiode means for receiving said optic signals and converting said optic signals to microwave signals;

a waveguide connected with said photodiode means for receiving said microwave signals, said waveguide having an open front portion through which said microwave signals are discharged;

fiber-optic means having an end portion connected with said optic signal generating means and an opposite end portion connected with said photodiode means, said optic signals being passed through said fiber-optic means from said optic signal generating means to said photodiode means;

said photodiode means and said waveguide being adapted for linear movement by a motion device in a plane parallel with a phased array antenna face having a plurality of transmit-receive modules secured thereon to pass said waveguide open front portion in proximity to said plurality of modules;

said transmit-receive modules successively receiving said microwave signals discharged through said waveguide open front portion;

a portion of said fiber-optic means adjacent said fiber-optic means end portion is passed through a feeding station interposed between said microwave signal generating means and said motion device; and said feeding station includes means engaging said fiber-optic means adjacent said fiber-optic means end portion to maintain fiber-optic means at a substantially constant value of tension as said photodiode means and said waveguide are moved in said preselected linear path.

3. A movable optical fiber system as set forth in claim 2 in which:

said fiber-optic means is maintained at said substantially constant value of tension to maintain said optic signal at said preselected phase.

4. A movable optical fiber system for directing microwave test and calibration signals to the individual transmit-receive modules of a phased array antenna comprising:

means for generating microwave modulated optic signals of preselected phase;

photodiode means for receiving said optic signals and converting said optic signals to microwave signals;

a waveguide connected with said photodiode means for receiving said microwave signals, said waveguide having an open front portion through which said microwave signals are discharged;

fiber-optic means having an end portion connected with said optic signal generating means and an opposite end portion connected with said photodiode means, said optic signals being passed through said fiber-optic means from said optic signal generating means to said photodiode means;

said photodiode means and said waveguide being adapted for linear movement by a motion device in a plane parallel with a phased array antenna face having a plurality of transmit-receive modules secured thereon to pass said waveguide open front portion in proximity to said plurality of modules;

said transmit-receive modules successively receiving said microwave signals discharged through said waveguide open front portion;

a feeding station interposed between said microwave signal generating means and said motion device;

said feeding station including at least a pair of aligned, first pulleys and at least one second pulley movable relative to said first pulleys;

said fiber-optic means adjacent said fiber-optic means end portion being reeved through said first and second pulleys in contacting relation therewith;

said fiber-optic means moving said second pulley in a preselected direction relative to said first pulleys as said photodiode means and said waveguide are moved in said preselected linear path parallel by said motion device; and tensioning means connected with said second pulley for exerting a preselected force on said fiber-optic means to maintain said fiber-optic means at a substantially constant value of tension as said second pulley is moved by said fiber-optic means.

5. A movable optical fiber system as set forth in claim 4 in which:

said tensioning means is formed from an anchor having a weight selected to exert said preselected force on said fiber-optic means.

6. A movable optical fiber system for directing microwave test and calibration signals to the individual transmit-receive modules of a phased array antenna comprising:

means for generating microwave modulated optic signals of preselected phase;

photodiode means for receiving said optic signals and converting said optic signals to microwave signals;

a waveguide connected with said photodiode means for receiving said microwave signals, said waveguide having an open front portion through which said microwave signals are discharged;

fiber-optic means having an end portion connected with said optic signal generating means and an opposite end portion connected with said photodiode means, said optic signals being passed through said fiber-optic means from said optic signal generating means to said photodiode means;

said photodiode means and said waveguide being adapted for linear movement by a motion device in a plane parallel with a phased array antenna face having a plurality of transmit-receive modules secured thereon to pass said waveguide open front portion in proximity to said plurality of modules;

said transmit-receive modules successively receiving said microwave signals discharged through said waveguide open front portion;

said motion device adapted to be positioned adjacent said phased array antenna face;

a support member having said photodiode means and said waveguide secured thereto, said support member being connected with said motion device;

said motion device being operable to move said support member with said photodiode means and said waveguide secured thereto in said preselected linear path parallel with said antenna face;

pulley means secured to said support member in proximity with said photodiode means and movable with said photodiode means and said waveguide;

a feeding station interposed between said microwave signal generating means and said motion device;

said feeding station including at least a pair of aligned, first pulleys and at least one second pulley movable relative to said first pulleys;

a portion of said fiber-optic means adjacent said fiber-optic means opposite end portion supported by a peripheral groove in said pulley means;

a portion of said fiber-optic means adjacent said fiber-optic means end portion reeved through said first and second pulleys in contacting relation therewith; and said fiber-optic means being maintained at a substantially constant value of tension by a tensioning means connected with said second pulley and operable to exert a preselected force on said fiber-optic means.

7. A movable optical fiber system as set forth in claim 6 in which:

the overall length of fiber-optic means in contact with said first and second pulleys and said pulley means remains substantially constant as said photodiode means and waveguide are moved by said motion device.

* * * * *